United States Patent
Erlbacher

(10) Patent No.: US 11,552,199 B2
(45) Date of Patent: Jan. 10, 2023

(54) HIGH-VOLTAGE CAPACITOR FOR INTEGRATION INTO ELECTRICAL POWER MODULES AND A METHOD FOR THE MANUFACTURE OF THE SAME

(71) Applicant: FRAUNHOFER-GESELLSCHAFT ZUR FOERDERUNG DER ANGEWANDTEN FORSCHUNG E.V., Munich (DE)

(72) Inventor: Tobias Erlbacher, Poxdorf (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 757 days.

(21) Appl. No.: 16/383,787

(22) Filed: Apr. 15, 2019

(65) Prior Publication Data
US 2019/0326449 A1 Oct. 24, 2019

(30) Foreign Application Priority Data
Apr. 20, 2018 (DE) .................. 10 2018 206 061.4

(51) Int. Cl.
*H01L 29/94* (2006.01)
*H01L 29/66* (2006.01)

(52) U.S. Cl.
CPC ...... *H01L 29/945* (2013.01); *H01L 29/66181* (2013.01)

(58) Field of Classification Search
CPC ...................................................... H01L 29/94
See application file for complete search history.

(56) References Cited

U.S. PATENT DOCUMENTS

| | | | |
|---|---|---|---|
| 6,891,714 B2 | 5/2005 | Sakashita | 361/306.3 |
| 7,738,226 B2 | 6/2010 | Berberich et al. | 361/91.7 |
| 2010/0195365 A1 | 8/2010 | Thyagarajan et al. | 365/94 |
| 2019/0229181 A1* | 7/2019 | Jia | H01L 21/02595 |

OTHER PUBLICATIONS

Pan et al.; *A Brief Introduction To Ceramic Capacitors*; IEEE Electrical Insulation Magazine; vol. 26, No. 3; May/Jun. 2010; pp. 44-50.

(Continued)

*Primary Examiner* — Marvin Payen
(74) *Attorney, Agent, or Firm* — Renner, Kenner, Greive, Bobak, Taylor & Weber

(57) ABSTRACT

A high-voltage capacitor for integration into electrical power modules has a silicon layer into which an arrangement of recesses is introduced on a front face. The front face with the recesses is coated with a dielectric layer or dielectric layer sequence, wherein the recesses are filled with an electrically conductive material. The silicon layer bears a contact metallisation on the front face and the rear face for purposes of making electrical contact with the capacitor. A layer of thermal $SiO_2$ is formed between the silicon layer and the dielectric layer or layer sequence. The dielectric layer or layer sequence has a layer thickness of ≥1000 nm and is formed from a ferroelectric or anti-ferroelectric material. The proposed high-voltage capacitor features a high integration density with a high capacitance and good heat dissipation properties.

8 Claims, 1 Drawing Sheet

(56) References Cited

OTHER PUBLICATIONS

Wang et al.; *Solution-Derived Electrodes and Dielectrics For Low-Cost and High-Capacitance Trench and Through-Silicon-Via (TSV) Capacitors*; IEEE $61^{st}$ Electronic Components and Technology Conference; 2011; pp. 1987-1991.

Gruenler et al.; *Monolithic 3D TSV-based high-voltage, high-temperature capacitors*; Microelectronic Engineering; vol. 156; Feb. 2016; pp. 19-23.

\* cited by examiner

HIGH-VOLTAGE CAPACITOR FOR INTEGRATION INTO ELECTRICAL POWER MODULES AND A METHOD FOR THE MANUFACTURE OF THE SAME

TECHNICAL FIELD OF APPLICATION

The present invention concerns a high-voltage capacitor for integration into electrical power modules, which has a silicon layer in which an arrangement of recesses is made on a front face, wherein the front face with the recesses is coated with a dielectric layer or layer sequence, the recesses are filled with an electrically conductive material, and the silicon layer bears a contact metallisation on the front face and the rear face respectively.

In power electronics, capacitors are required that can withstand high electrical power and high electrical voltages. These high-voltage capacitors must have good heat dissipation properties and should, if possible, be able to be integrated together with the other power semiconductor components on a common semiconductor substrate.

PRIOR ART

High-voltage ceramic capacitors with a multi-layered structure are suitable for use in power electronics, as they are known, for example, from M.-J. Pan et al., "A Brief Introduction to Ceramic Capacitors", IEEE Electrical Insulation Magazine, Vol. 26, No. 3 (2010), pages 44 to 50. In such multi-layer ceramic capacitors (MLCC: multi-layer-cofired-ceramics), ceramic layers are applied to metallic conductors and stacked on top of each other to achieve a high integration density. By using (anti-)ferroelectric ceramics with a very high dielectric constant (>100), high capacitance values can be generated in a small space. However, multi-layer ceramic capacitors of this type exhibit poor heat dissipation, and thus a low AC voltage load capacity and a low tolerance to current ripple. For power electronic applications, the capacitance must therefore be appropriately oversized.

U.S. Pat. No. 7,738,226 B2 discloses a high-voltage silicon capacitor in which the upper or front face of the silicon substrate has a trench pattern so as to increase the surface area. A dielectric layer is applied to the front face with the trenches. The trenches are filled with an electrically conductive material such as polysilicon, and the silicon substrate is provided with a contact metallisation on the front and rear faces. Silicon dioxide and silicon nitride are proposed as materials for the dielectric layer. Reference is also made to the possible use of dielectric layers with high dielectric constants. However, the publication does not provide any information on the thickness of the dielectric layers, and the problem of the reliability of the component at higher layer thicknesses.

The object of the present invention is to specify a high-voltage capacitor for integration into electrical power modules, which enables a high integration density with good heat dissipation, and has a sufficiently high reliability for use in electrical power modules.

PRESENTATION OF THE INVENTION

The object is achieved with the high-voltage capacitor and the method according to patent claims 1 and 8. Advantageous embodiments of the high-voltage capacitor are the subject matter of the dependent patent claims, or can be found in the following description together with the example of embodiment.

The proposed high-voltage capacitor has a silicon layer with an arrangement of recesses on the front face. The silicon layer is preferably formed by a silicon substrate or a region of a silicon substrate. Here the front face is arbitrarily to be understood to be the face on which the recesses are introduced into the silicon layer. In what follows the opposite face is then referred to as the rear face. The recesses can, for example, be designed as trenches running side by side, in particular in parallel, or also in a concentric arrangement. Other geometries can also be designed, such as recesses on the surface that are rectangular in cross-section. The front face with the recesses is coated with a dielectric layer or a dielectric layer sequence. The said dielectric layer or layer sequence thus covers both the sidewalls and, if applicable, the bottom walls, of the recesses, as well as the surface regions between the recesses. The recesses with this coating are filled with an electrically conductive material, which preferably also forms a continuous layer above the dielectric layer or layer sequence on the front face of the silicon layer. A contact metallisation is then applied to the front face and the rear face of the silicon layer, via which electrical contact can be made with the high-voltage capacitor. The proposed high voltage capacitor is characterised in that a layer of thermal SiO2 is formed between the silicon layer and the dielectric layer or layer sequence; the dielectric layer or layer sequence has a layer thickness of ≥1000 nm, and the dielectric layer or layer sequence is formed of a ferroelectric or anti-ferroelectric material, or contains a ferroelectric or anti-ferroelectric material.

A high integration density at high capacitance values is achieved by the design of the high-voltage capacitor with the above recess structure and the high layer thickness of the dielectric layer or layer sequence of a ferroelectric or anti-ferroelectric material as the capacitor dielectric. The problems occurring with high layer thicknesses of ferroelectric or anti-ferroelectric materials are largely circumvented by the use of the thermal oxide ($SiO_2$), since this intermediate layer avoids interface states in the silicon that can lead to defects and a degradation of the insulator during operation due to increased current flow in the dielectric layer. By this means a high reliability of the capacitor is achieved.

By virtue of its structure, the proposed capacitor can easily be integrated on power semiconductor substrates, in particular on DCB substrates (DCB: direct copper bonding), and, by virtue of the large thermal contact area over the rear face of the semiconductor or silicon chip, very good heat dissipation can thereby be achieved. The capacitor, together with power semiconductor components, can also be mounted on ceramic transfer substrates. The proposed structure achieves high capacitances of >200 nF and thus a high integration density, even in applications with voltages of 600 volts or higher. This allows the proposed capacitor to be used economically in power modules by virtue of its small space requirement. Its use as an intermediate circuit capacitor thereby also makes economic sense.

In a preferred development of the proposed capacitor, a layer of another dielectric material, in particular $SiO_2$ or $Si_3N_4$, is introduced between the dielectric layer or layer sequence and the contact metallisation on the front face. By combining the ferroelectric or anti-ferroelectric capacitor dielectric with such an additional dielectric layer, an increase in the electric strength is achieved, together with stress compensation, leading to a further increase in the reliability of the component. This can also be achieved by forming the dielectric layer sequence from a plurality of layers of the ferroelectric or anti-ferroelectric material with intermediate dielectric layers of one or a plurality of other materials, in particular $SiO_2$ and/or $Si_3N_4$. Such a combination of the layers also allows either an increase of the deposition rate, or a further reduction of defects during deposition, since it influences the nucleation of the deposition of the ferro- or anti-ferrodielectric.

In the method for the manufacture of the proposed high-voltage capacitor, the dielectric layer or layer sequence is produced by conformal (isotropic) deposition, preferably by means of MOCVD (metallo-organic chemical vapour deposition). Materials such as barium strontium titanate (BST), lead zirconium titanate (PZT) or lanthanum lead zirconium titanate (PLZT) can be used. Needless to say, this is not an exhaustive list. Here the structuring of the surface of the silicon layer or the silicon substrate takes place in a manner of known art, preferably by suitable etching steps in conjunction with masking. The thermal $SiO_2$ layer is generated by suitable temperature treatment in oxygen or water vapour, for example for a period of 30 seconds to 10 hours in a temperature range between 850° C. and 1150° C.

The filling of the recesses with the electrically conductive material and also the manufacture of the contact metallisations can take place, for example, by the deposition of polysilicon, or by conformal metal deposition. The thickness of the contact metallisation can be selected such that a local self-healing of the capacitor is achieved in the event of leakage currents occurring. Here the thickness of the contact metallisation is chosen to be sufficiently thin, preferably in the range from 10 to 30 nm, so as to achieve intense heating in the event of a local short circuit or leakage current, as a result of which the metallic material evaporates locally. The leakage current is thus inhibited at this point.

Due to the large thickness of the dielectric layer, a fast deposition process, such as MOCVD, is required to achieve economic manufacturability of the capacitor. However, as a result of the correspondingly high deposition rates, defects can more easily occur in the layer, which are frequently caused by interface states at the interface to the silicon substrate. By using the thermal $SiO_2$ layer between the silicon substrate and the dielectric layer, such interfacial conditions are avoided, so that a significantly lower defect density, and thus a higher reliability of the capacitor, is achieved by virtue of the high deposition rate. Here the upper boundary of the dielectric layer can also be created using a slower deposition process such as ALD, in order to avoid defects at the point of transition to the electrode that could lead to leakage currents at this point. This also applies to the deposition of the $Si_3N_4$ or $SiO_2$ layer optionally introduced between the dielectric layer of the ferroelectric or anti-ferroelectric material and the electrode; this layer can be deposited completely using a slow deposition process such as ALD (atomic layer deposition).

The proposed high-voltage capacitor can be used very advantageously as a damping component, or as an intermediate circuit capacitor on the transfer substrate (DCB) of a power module, together with the circuit breakers. Other applications of the high-voltage capacitor are also possible, in which a high dielectric strength and good heat dissipation are required.

BRIEF DESCRIPTION OF THE FIGURES

In what follows the proposed high-voltage capacitor is explained in more detail with the aid of an example of embodiment, in conjunction with the figures. Here.

PATHS TO EMBODIMENT OF THE INVENTION

Figure 1:
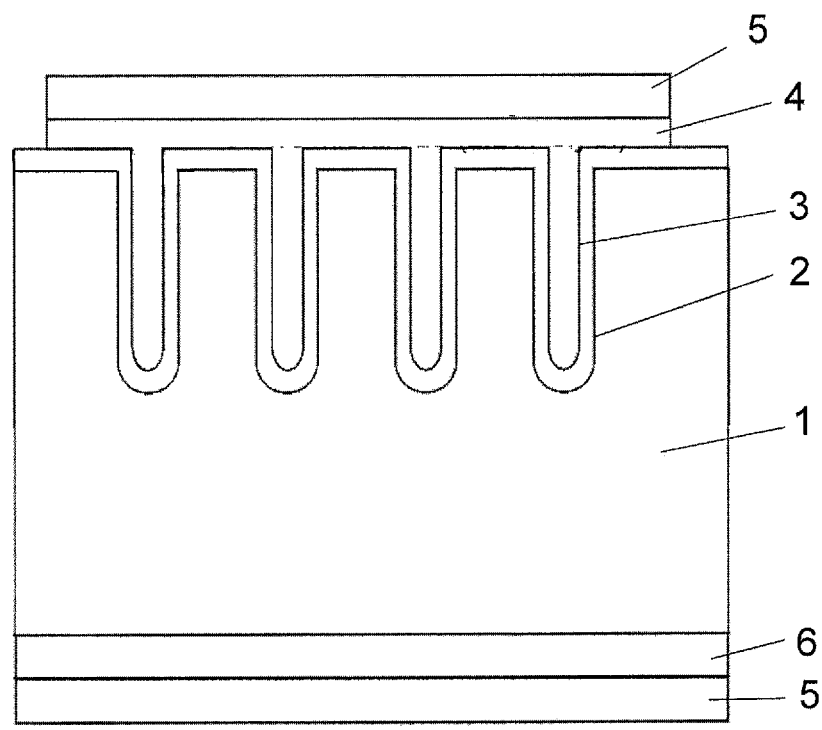
FIG. 1 shows a schematic cross-section through a high-voltage capacitor in accordance with an example of embodiment of the present invention.

In what follows the proposed capacitor for power electronics is described in more detail with the aid of an example of embodiment in which the capacitor is formed in a silicon substrate. To this end FIG. 1 shows a schematic structure of the capacitor, shown in this example in a cross-section through the silicon substrate 1. Parallel trenches 2 are introduced into the front face of this silicon substrate 1; these have a high aspect ratio of ≥10:1 (depth to width). This high aspect ratio is not apparent from the figure for reasons of presentability. The surface of the silicon substrate 1, including the trenches 2, is covered with a thermal $SiO_2$ layer, which cannot be discerned in FIG. 1. A dielectric layer 3 of a ferroelectric or anti-ferroelectric material with a thickness of ≥1000 nm is applied onto this layer, as is schematically indicated in FIG. 1. For this purpose, barium strontium titanate, or lead zirconium titanate can, for example, be used as materials. The trenches 2 are filled with an electrically conductive material, such as polysilicon, which also extends over the front face of the silicon substrate 1 and forms an upper electrode layer 4. The individual layers can, for example, be deposited by means of MOCVD. Finally, a contact metallisation layer 5 for purposes of making electrical contact with the capacitor is applied to the front and rear faces of the silicon substrate 1. On the rear face, between the said contact metallisation 5 and the silicon substrate 1, there can also be a lower electrode layer 6 of a suitable electrically conductive material.

Figure 2:
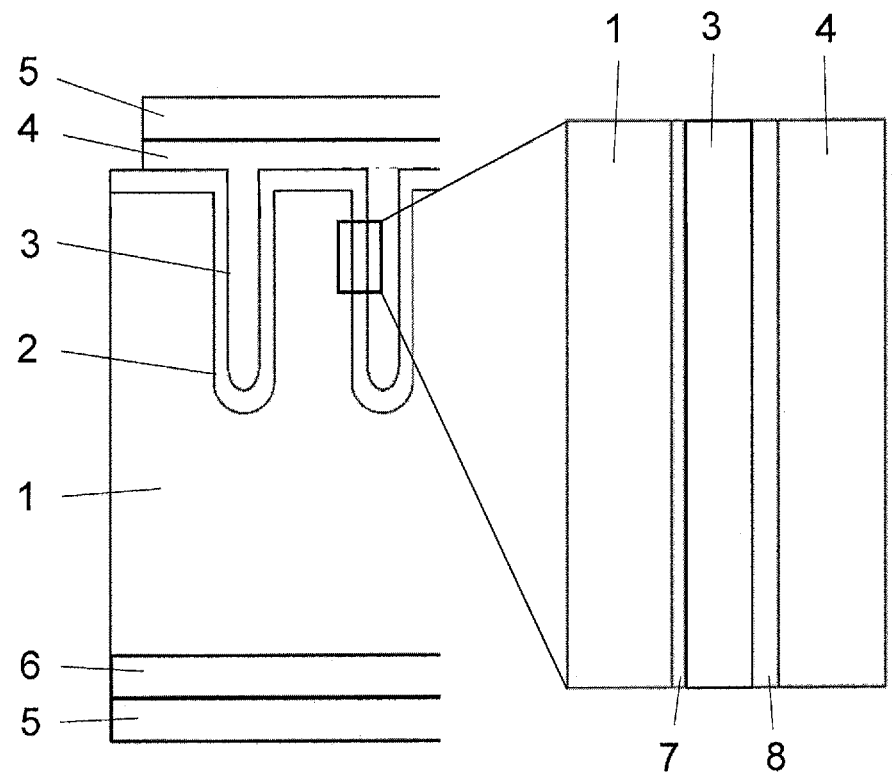
FIG. 2 shows a detail from FIG. 1, in which the layered structure of the proposed high-voltage capacitor can be discerned.

FIG. 2 shows a detail from the cross-section of FIG. 1, showing the layered structure between the silicon substrate 1 and the upper electrode layer 4 in the high-voltage capacitor of this example of embodiment. From the figure it can be seen that the silicon substrate 1 is coated with a thermal oxide layer 7 (thermal $SiO_2$), which thus lies between the dielectric layer 3 and the silicon substrate 1. By means of this thermal oxide, interface states at the point of transition from the dielectric layer 3 to the silicon substrate 1, which can lead to defects in the dielectric layer 3, are avoided. This increases the reliability of the capacitor, even with the ferroelectric or anti-ferroelectric layers of high layer thickness that are here present. The dielectric layer 3 of ferroelectric or anti-ferroelectric material has a correspondingly high dielectric constant (>100) and enables a high capacitor reverse voltage. In the present example, a layer 8 of silicon nitride ($Si_3N_4$) is also applied to this dielectric layer 3, which thus lies between the upper electrode layer 4 and the dielectric layer 3. This additional dielectric layer, preferably applied by means of CVD, which can also be formed, for example, from $SiO_2$, contributes to a minimising of the leakage current at the interface to the upper electrode.

The proposed capacitor structure achieves a high integration density with a high dielectric strength and high capacitance values, making the proposed capacitor suitable for power electronic applications on a DCB substrate. The following Table 1 shows a comparison of the characteristic values of such a capacitor with published characteristic values of other high-voltage capacitors, which have dielectrics made of $SiO_2$ or $Si_3N_4$. It can be seen from the table that the proposed high-voltage capacitor has a very high integration density and quality rating compared to the high-voltage capacitors in silicon technology that have been implemented to date.

TABLE 1

| Dielectric | Breakdown voltage | Integration density | Quality rating |
|---|---|---|---|
| $SiO_2/Si_3N_4$ | 550 V | 2 $nF/mm^2$ | 1.1 $\mu C/mm^2$ |
| $SiO_2/Si_3N_4$ | 1000 V | 0.7 $nF/mm^2$ | 0.7 $\mu C/mm^2$ |
| $SiO_2/Si_3N_4$ | 500 V | 2.9 $nF/mm^2$ | 1.45 $\mu C/mm^2$ |
| $SiO_2/Si_3N_4$ | 280 V | 3.5 $nF/mm^2$ | 0.98 $\mu C/mm^2$ |
| (Anti-)ferroelectrics | 1000 V | >7 $nF/mm^2$ | >7 $\mu C/mm^2$ |

LIST OF REFERENCE SYMBOLS

1 Silicon substrate
2 Trenches
3 Dielectric layer
4 Upper electrode layer
5 Contact metallisation
6 Lower electrode layer
7 Thermal oxide layer ($SiO_2$)
8 Silicon nitride layer

The invention claimed is:

1. A high-voltage capacitor for integration into electrical power modules, which capacitor has a silicon layer into which an arrangement of recesses is introduced on a front face, wherein
the front face, with the recesses, is coated with a dielectric layer or layer sequence, the recesses are filled with an electrically conductive material, and the silicon layer bears a contact metallisation (123a) on the front face and on the rear face in each case, characterised in that, a layer of thermal $SiO_2$, is formed between the silicon layer and the dielectric layer or layer sequence said layer of thermal $SiO_2$ being in contact with the dielectric layer or layer sequence, and the dielectric layer or layer sequence has a layer thickness of ≥1000 nm is formed of a ferroelectric or anti-ferroelectric material, or contains a ferroelectric or anti-ferroelectric material.

2. The high-voltage capacitor in accordance with claim 1, characterised in that a further dielectric layer, in particular of $SiO_2$ or $Si_3N_4$, is formed between the dielectric layer or layer sequence and the contact metallisation on the front face.

3. The high-voltage capacitor in accordance with claim 1, characterised in that the electrically conductive material is at least partially polysilicon or a metallic material.

4. The high-voltage capacitor in accordance with claim 1, characterised in that the dielectric layer sequence comprises a plurality of dielectric layers of the ferroelectric or anti-ferroelectric material, with intermediate dielectric layers of one or a plurality of other materials, in particular $SiO_2$ and/or $Si_3N_4$.

5. The high-voltage capacitor in accordance with claim 1, characterised in that the recesses are trenches.

6. The high-voltage capacitor in accordance with claim 1, characterised in that the contact metallisation has a thickness by means of which a local self-healing of the capacitor is achieved in the event of leakage currents occurring.

7. The high-voltage capacitor in accordance with claim 1, further comprising,
a substrate of an electrical power module which carries the high-voltage capacitor as a damping component or as an intermediate circuit capacitor.

8. A method for the manufacture of a high-voltage capacitor in accordance with claim 1, in which the dielectric layer or layer sequence is produced by conformal deposition.

* * * * *